(12) United States Patent
Ho et al.

(10) Patent No.: US 6,417,088 B1
(45) Date of Patent: Jul. 9, 2002

(54) METHOD OF APPLICATION OF DISPLACEMENT REACTION TO FORM A CONDUCTIVE CAP LAYER FOR FLIP-CHIP, COB, AND MICRO METAL BONDING

(75) Inventors: Kwok Keung Paul Ho; Yi Xu; Simon Chooi; Yakub Aliyu; Mei Sheng Zhou; John Leonard Sudijono; Subhash Gupta; Sudipto Ranendra Roy, all of Singapore (SG)

(73) Assignee: Chartered Semiconductor Manufacturing Ltd., Singapore (SG)

(*) Notice: Subject to any disclaimer, the term of this patent is extended or adjusted under 35 U.S.C. 154(b) by 16 days.

(21) Appl. No.: 09/624,019

(22) Filed: Jul. 24, 2000

(51) Int. Cl.[7] ............................................... H01L 21/44
(52) U.S. Cl. ..................................... 438/612; 438/108
(58) Field of Search ................................ 438/612, 617, 438/614, 118; 257/781, 784, 786

(56) References Cited

U.S. PATENT DOCUMENTS

| | | |
|---|---|---|
| 5,376,235 A | 12/1994 | Langley .................... 156/664 |
| 5,384,284 A | 1/1995 | Doan et al. |
| 5,462,892 A | 10/1995 | Gabriel |
| 5,567,981 A * | 10/1996 | Bhansali et al. ............ 257/643 |
| 5,647,942 A | 7/1997 | Haji ........................... 156/281 |
| 5,719,087 A | 2/1998 | Chen et al. ................. 438/612 |
| 5,733,466 A | 3/1998 | Benebo et al. ................ 216/13 |
| 5,785,236 A | 7/1998 | Cheung et al. .......... 228/180.5 |
| 5,891,756 A | 4/1999 | Erickson .................... 438/108 |
| 5,910,644 A | 6/1999 | Goodman et al. .......... 174/260 |
| 5,985,765 A | 11/1999 | Hsiao et al. ................ 438/694 |
| 6,043,125 A * | 3/2000 | Williams et al. ............ 438/270 |

* cited by examiner

Primary Examiner—Hoai Ho
Assistant Examiner—Dung A Le
(74) Attorney, Agent, or Firm—George O. Saile; Rosemary L. S. Pike; Stephen G. Stanton

(57) ABSTRACT

A method of forming a conductive cap layer over a metal bonding pad comprises the following steps. A semiconductor structure is provided having an exposed, recessed metal bonding pad within a layer opening. The layer has an upper surface. The exposed metal bonding pad is treated with a solution containing soluble metal ions to form a conductive cap over the metal bonding pad. The conductive cap layer is comprised of the solution metal and has a predetermined thickness. An external bonding element may then be bonded to the conductive cap, forming an electrical connection with the metal bonding pad.

22 Claims, 2 Drawing Sheets

METHOD OF APPLICATION OF DISPLACEMENT REACTION TO FORM A CONDUCTIVE CAP LAYER FOR FLIP-CHIP, COB, AND MICRO METAL BONDING

BACKGROUND OF THE INVENTION

Copper (Cu) is gradually replacing aluminum (Al) as the interconnect material in integrated circuits. However, a problem arises due to the fact that the top layer Cu pad does not form a good connection with the normal bonding techniques. This is mainly due to the poor quality of copper oxide formed on the Cu pad surface upon exposure to the atmosphere and moisture.

In order to ensure a good contact between the chip and the bonding element, either the top Cu metal layer has to be replaced by Al, or an indirect way of bonding is needed. Both of these options increase the complexity and cost.

U.S. Pat. No. 5,462,892 to Gabriel describes a method of processing a semiconductor wafer so as to inhibit corrosion of aluminum or other metal interconnection lines. Such interconnection lines may be composed of tungsten (W)/titanium (Ti), aluminum (Al), aluminum-copper (Cu), or successive layers of W/Ti and Al—Cu. Once the interconnection lines are etched, the wafer is moved from an etching chamber a post-etching processing chamber, without exposure to the atmosphere, where a thin native oxide is formed on the exposed sidewalls of the just etched interconnection lines. The oxide layer protects the wafer surface from acidic corrosion upon subsequent exposure to the atmosphere.

U.S. Pat. No. 5,376,235 to Langley describes a process of using a wet chemical process to remove chlorine from dry etched metal features on a semiconductor wafer before an alloy step. The wet chemical process includes a 20:1 phosphoric acid solution dip that prevents the formation of voids in the etched metal features during subsequent alloying steps up to about 425° C. by removing chlorine.

U.S. Pat. No. 5,384,284 to Doan et al. describes a process to form a pad interconnect whereby a metal layer or a metal alloy is bonded to an underlying aluminum pad by chemical vapor deposition (CVD) or by electroless deposition. A conductive epoxy film is then adhered to the metal layer. The metal layer may be comprised of, for example, Cu, Ni, W, Au, Ag, or Pt and the metal alloy may be comprised of titanium nitride, for example.

U.S. Pat. No. 5,719,087 to Chen et al. describes a method for forming a bonding pad on a semiconductor integrated circuit that includes forming a protective, dielectric cap on the surface of the bonding pad prior to deposition of the final passivation layer.

U.S. Pat. No. 5,891,756 to Erickson describes a method for forming a solder bump pad, and specifically to converting a wire bond pad of a surface-mount IC device to a flip-chip solder bump pad such that the IC device can be flip-chip mounted to a substrate. The method uses a Ni layer over the pad.

U.S. Pat. No. 5,733,466 to Benebo et al. describes a method of electrodepositing a gold metallurgy onto a feature of a printed circuit board. A copper layer is electrolessly deposited over the surface of a printed circuit board, patterned and etched, leaving the specific features to be plated. A layer of photoresist is applied atop the partially etched copper layer and is exposed and developed to uncover the features to be plated. These features are then plated with the metallurgy of choice, such as gold.

U.S. Pat. No. 5,647,942 to Haji describes a wire bonding method including the step of removing a thin surface layer of an electrode comprising a copper layer and a nickel layer formed on the surface of the copper layer and coated with gold on the surface. This removes nickel hydroxide and nickel oxide present on the gold film.

U.S. Pat. No. 5,785,236 to Cheung et al. describes a process for forming electrical connection between metal wires and metal interconnections not otherwise bondable, i.e. gold and aluminum wires and copper interconnects. The copper pads are modified, by forming an aluminum pad thereover, to permit the use of conventional wire bonding techniques.

U.S. Pat. No. 5,985,765 to Hsiao et al. describes a method for reducing bonding pad loss using a capping layer, preferably comprised of tungsten, when contact openings are etched to the bonding pads while much deeper fuse openings are concurrently etched.

U.S. Pat. No. 5,910,644 to Goodman et al. describes a printed circuit connector pad device having a tri-plated layer. The first, lower plated layer, is an initial diffusion resistant coating of nickel. The second, intermediate plated layer, is a hard, wear resistant noble or semi-noble metal such as pure palladium or a layer of gold hardened by cobalt, nickel, iron, or a combination of these dopants to effect a hardness of 200 to 250 (Knoop scale). The second layer provides pad on pad connector reliability and affords a metallurgically stable solder joints and wire-bond interfaces. the third, upper plated layer, is soft gold.

SUMMARY OF THE INVENTION

Accordingly, it is an object of the present invention to form a conductive cap layer over a copper bonding pad for flip-chip, chip-on-board, and micro metal bonding.

It is another object of the present invention to provide a method of bonding a metal wire to a copper bonding pad.

A further object of the present invention is to provide a method of forming a conductive cap layer over a copper bonding pad to permit bonding a metal wire thereto.

Another object of the present invention is to provide a method of forming a low resistivity and inert metal cap layer on top of a copper bonding pad for direct metal bonding.

Yet another object of the present invention is to provide a method of selective formation of a low resistivity metal cap layer on top of a copper bonding pad to improve bonding adhesion to the copper bonding pad and to reduce process complexity of bonding on a copper bonding pad.

Other objects will appear hereinafter.

It has now been discovered that the above and other objects of the present invention may be accomplished in the following manner. Specifically, a semiconductor structure is provided having an exposed, recessed metal bonding pad within a layer opening. The layer has an upper surface. The exposed metal bonding pad is treated with a solution containing soluble metal ions to form a conductive cap over the metal bonding pad. The conductive cap layer is comprised of the solution metal and has a predetermined thickness. An external bonding element may then be bonded to the conductive cap, forming an electrical connection with the metal bonding pad.

BRIEF DESCRIPTION OF THE DRAWINGS

The features and advantages of the method of forming a conductive cap layer over a metal bonding pad according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
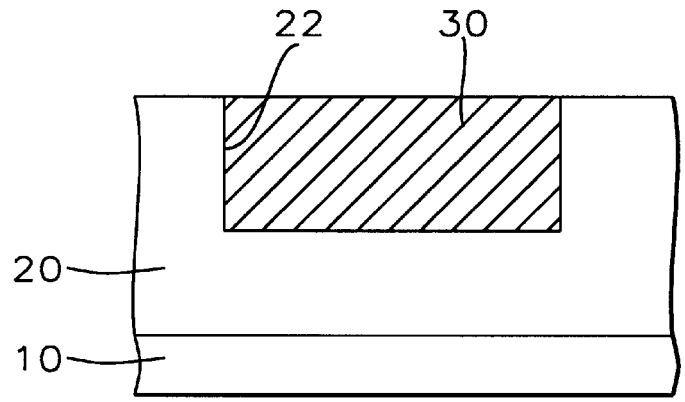
FIGS. 1 to 6 schematically illustrates in cross-sectional representation a preferred embodiment of the present invention.

Accordingly FIG. 1 shows a schematic cross-sectional diagram of metal bonding pad 30 within opening 22 of intermetal dielectric (IMD) layer 20 of an integrated circuit that includes semiconductor structure 10.

Semiconductor structure 10 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

IMD layer 20 is formed over semiconductor structure 10. Bonding pad opening 22 is etched within IMD layer 20. Metal bonding pad 30 is formed within bonding pad opening 22.

Unless otherwise specified, all structures, layers, etc. may be formed or accomplished by conventional methods known in the prior art.

Metal bonding pad 30 may be comprised of copper or a copper alloy such as AlCu, and is preferably copper, and contacts underlying circuitry (not shown) covered by IMD layer 20. For purposes of illustration, metal bonding pad 30 will be considered comprised of copper hereafter.

Next, copper bonding pad 30 is made to be a recessed structure.

Figure 2:
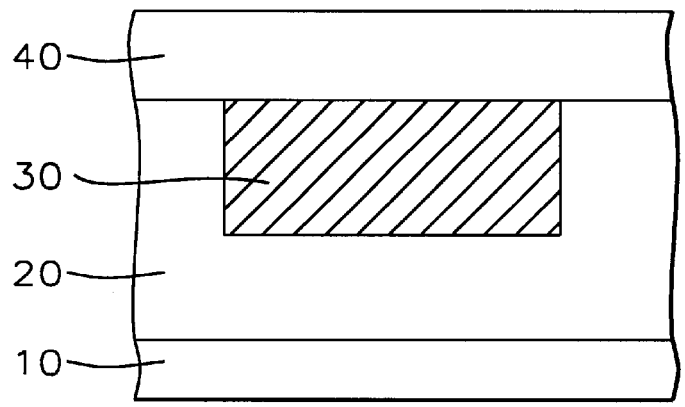

For example, as shown in FIG. 2, passivation layer 40 is formed over copper bonding pad 30 and IMD layer 20. Passivation layer 40 has a thickness from about 1000 to 10,000 Å, and more preferably from about 2000 to 7000 Å.

Figure 3:
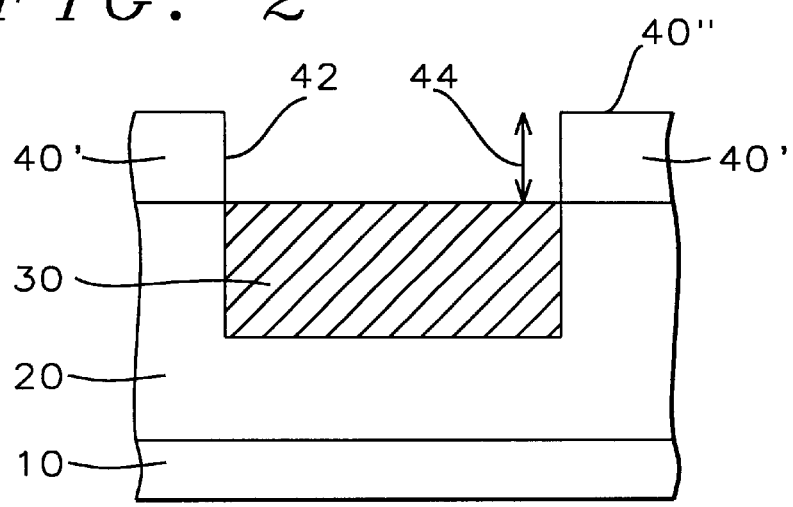

As shown in FIG. 3, passivation layer 40 may be masked (not shown) and etched to form opening 42 exposing copper bonding pad 30 and leaving passivation layer portions 40' on either side of copper bonding pad 30. Copper bonding pad 30 effectively becomes a recessed structure. Other methods made be used to form analogous recessed copper bonding pad 30 structures.

The recessed copper bonding pad 30 structure of FIG. 3 is recessed 44 from about 1000 to 10,000 Å, and more preferably from about 2000 to 7000 Åbeneath the surface 40" of patterned passivation layer 40.

Figure 4:
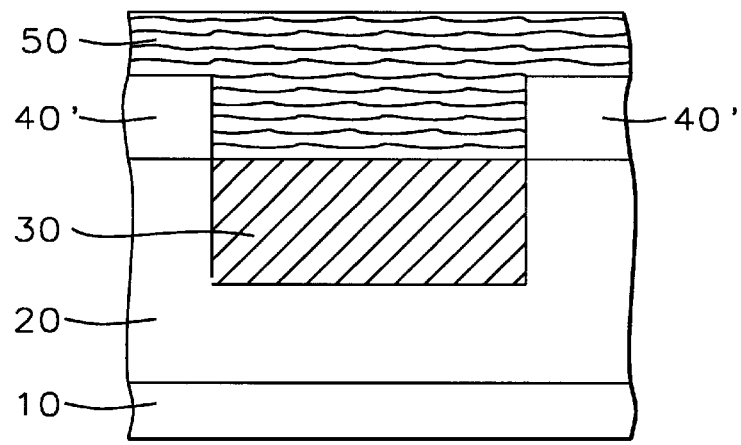
Figure 5:
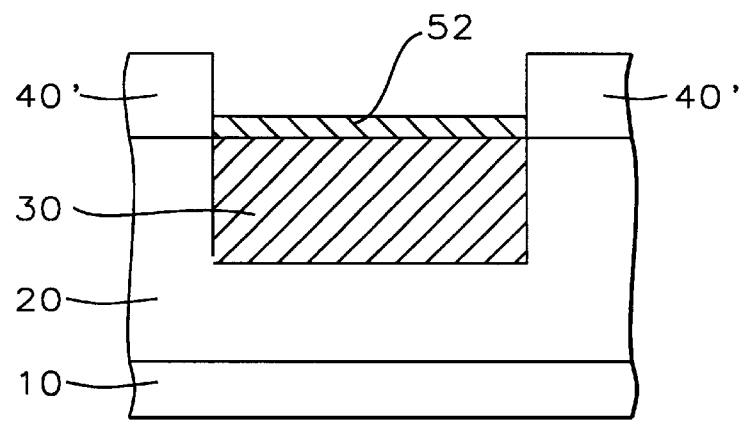

As shown in FIG. 4, in a key step of the invention, copper bonding pad 30 is then treated with aqueous solution 50 by a displacement reaction at a temperature: from about 5 to 35° C., and more preferably from about 15 to 25° C. with agitation.

Composition of Solution 50

Gold (Au), a well known material for lowering the contact resistance of printed-circuit-boards (PCBs), is a suitable noble metal for the preferred method of the present invention. This is the case because gold has:

1) a much higher electrochemical potential (E°) than copper (see the table below), i.e.
   $E°(Au^{3+}/Au)=1.50$ V; and
   $E°(Cu^{2+}/Cu)=0.34$ V;
2) a low resistivity;
3) a low contact resistance between external bonding element 60 and the bond pad 30 with capping layer 52 which is usually comprised of gold or aluminum wire (see FIG. 6); and
4) a good adhesion between the external bonding element 60 and the bonding pad 30 with capping layer 52.

Since simple Au (I) and Au (III) ions are very oxidizing and their reduction potentials are large enough to oxidize water molecules, the soluble Au (I) an d Au (III) complex ions are used in the composition of aqueous solution 50. Listed below are the gold (Au) complex ions that may be used to compose the aqueous solution 50:

| Ion | Standard Redox Potential |
| --- | --- |
| $[Au^I Cl_2]^-$ | +1.15 V |
| $[Au^{III} Cl_4]^-$ | +1.00 V |
| $[Au^I Br_2]^-$ | +0.96 V |
| $[Au^{III} Br_4]^-$ | +0.86 V |
| $[Au^I I_2]^-$ | +0.56 V |
| $[Au^{III} I_4]^-$ | +0.57 V |
| $[Au^I (SCN)_2]^-$ | +0.67 V |
| $[Au^{III} (SCN)_4]^-$ | +0.64 V |
| $[Au^I (NH_3)_2]$ | +0.56 V |

If alkali metal cations (e.g. $K^+$, $Na^+$, etc.) are used, a few atomic layers of copper will be displaced by gold ions. If hydrogen or ammonium cations are used, the cations will assist in the etching of copper and thus thicker gold deposit will result. Alternatively, ammonium or amine salts in buffer solution can be added to increase the gold deposit thickness.

Since the gold capping layer 52 is used to improve the adhesion between the bond pad 30 and the gold wire 60 bond, a thickness of few atomic layers is sufficient though a thicker gold layer may improve the reliability. Thus the thickness of gold capping layer 52 should preferably be from a few atomic layers to about 5000 Å, and more preferably from a few atomic layers to about 1000 Å.

Reaction of Solution 50 With Copper Bonding Pad 30

The front-side of the wafer (the side with copper bond pad 30 exposed) is immersed in solution 50 at room temperature with agitation. The back-side and the bevel of the wafer are sealed against the solution by conventional methods. Since the complex gold ions have a higher standard redox potential that that of copper (+0.34 V), the copper metal is oxidized and replaced by the gold metal as shown in the equations below:

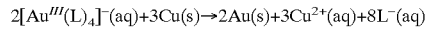

where "L" may be, for example, Cl, Br, I, SCN, or $NH_3$ (see the above table).

The structure is cleaned and dried.

Figure 6:
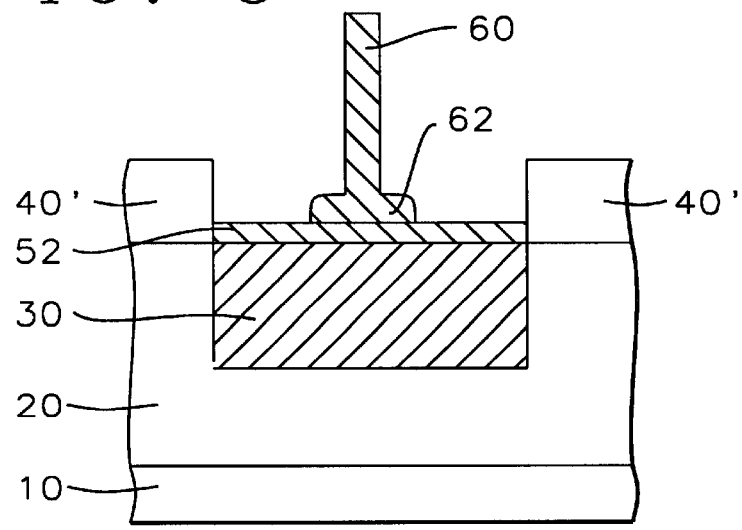

As shown in FIG. 6, external bonding element 60 may then be positioned to contact, or connect, to conductive cap layer 52 at 62, allowing an electrical connection between bonding element 60 and recessed copper bonding pad 30.

External bonding element 60 may be comprised of gold or aluminum, and preferably gold, and may be a wire. For purposes of illustration, bonding element 60 will be considered to be a gold wire hereafter.

Gold wire (external bonding element) 60 may be placed vertically above bond pad 30 with capping layer 52 at an angle of about 90°.

Conductive cap layer 52 has a better adhesion to external bonding element 60 than would a direct bonding of gold wire 60 to copper bonding pad 30. Thus, a lower contact resistance can be achieved through the use of conductive cap layer 52 over copper bonding pad 30. Further, a noble metal such as Au has a low resistivity, which also lowers the overall resistance of the contact 62.

While particular embodiments of the present invention have been illustrated and described, it is not intended to limit the invention, except as defined by the following claims.

We claim:

1. A method of forming a conductive cap layer over a metal bonding pad, comprising the steps of:

providing a semiconductor structure having an exposed, recessed metal bonding pad within a layer opening; said layer having an upper surface; and treating said exposed metal bonding pad with a solution containing a soluble metal ions to form a conductive cap layer comprised of said solution metal over said metal bonding pad; said conductive cap layer having a predetermined thickness.

2. The method of claim 1, including the step of bonding an external bonding element to said conductive cap layer to form an electrical connection with said metal bonding pad.

3. The method of claim 1, including the step of bonding an external bonding element to said conductive cap layer to form an electrical connection with said metal bonding pad; wherein said metal bonding pad is comprised of a material selected from the group comprising copper and a copper alloy; and said external bonding element is comprised of a material selected from the group comprising aluminum and gold.

4. The method of claim 1, including the step of bonding an external bonding element to said conductive cap layer to form an electrical connection with said metal bonding pad; wherein said metal bonding pad is comprised of copper, and said external bonding element is comprised of a material selected from the group comprising gold and aluminum.

5. The method of claim 1, including the step of bonding an external bonding element to said conductive cap layer to form an electrical connection with said metal bonding pad; wherein said external bonding element is a wire.

6. The method of claim 1, wherein said conductive cap layer is from about a few atomic layers to 5000 Å thick.

7. The method of claim 1, wherein said conductive cap layer is from about a few atomic layers to 1000 Å thick.

8. The method of claim 1, wherein said metal bonding pad is recessed from about 1000 to 10,000 Å below said top surface of said layer.

9. The method of claim 1, wherein said metal bonding pad is recessed from about 2000 to 7000 Å below said top surface of said layer.

10. The method of claim 1, wherein said soluable metal ions are selected from the group comprising $[Au^I Cl_2]^-$, $[Au^{III} Cl_4]^-$, $[Au^I Br_2]^-$, $[Au^{III} Br_4]^-$, $[Au^I I_2]^-$, $[Au^{III} I_4]^-$, $[Au^I(SCN)_2]^-$, $[Au^{III}(SCN)_4]^-$, and $[Au^I(NH_3)_2]^-$.

11. A method of bonding an external bonding element to a metal bonding pad, comprising the steps of:

providing a semiconductor structure having an exposed, recessed metal bonding pad within a layer opening; said layer having an upper surface;

treating said exposed metal bonding pad with a solution containing soluble metal ions to form a conductive cap layer comprised of said solution metal over said metal bonding pad; said conductive cap layer having a predetermined thickness; and bonding an external bonding element to said conductive cap layer to form an electrical connection with said metal bonding pad.

12. The method of claim 11, wherein said metal bonding pad is comprised of a material selected from the group comprising copper and a copper alloy; and said external bonding element is comprised of a material selected from the group comprising aluminum and gold.

13. The method of claim 11, wherein said metal bonding pad is comprised of copper, and said external bonding element is comprised of a material selected from the group comprising aluminum and gold.

14. The method of claim 11, wherein said external bonding element is a wire.

15. The method of claim 11, wherein said conductive cap layer is from about a few atomic layers to 5000 Å thick.

16. The method of claim 11, wherein said conductive cap layer is from about a few atomic layers to 1000 Å thick.

17. The method of claim 11, wherein said external bonding element is positioned at an angle of about 90° relative to said conductive cap layer.

18. The method of claim 11, wherein said metal bonding pad is recessed from about 1000 to 1000 Å below said top surface of said layer.

19. The method of claim 11, wherein said metal bonding pad is recessed from about 2000 to 7000 Å below said top surface of said layer.

20. The method of claim 11, wherein said soluble metal ions are selected from the group comprising $[Au^I Cl_2]^-$, $[Au^{III} Cl_4]^-$, $[Au^I Br_2]^-$, $[Au^{III} Br_4]^-$, $[Au^I I_2]^-$, $[Au^{III} I_4]^-$, $[Au^I(SCN)_2]^-$, $[Au^{III}(SCN)_4]^-$, and $[Au^I(NH_3)_2]^-$.

21. A method of bonding an external bonding element to a metal bonding pad, comprising the steps of:

providing a semiconductor structure having an exposed copper bonding pad;

treating said exposed copper bonding pad with a solution containing a soluble gold complex ions to form a gold conductive cap layer over said copper bonding pad; said gold conductive cap layer having a predetermined thickness; and bonding an external bonding element to said gold conductive cap layer to form an electrical connection with said copper bonding pad.

22. The method of claim 21, wherein said soluble gold complex ions are selected from the group comprising $[Au^I Cl_2]^-$, $[Au^{III} Cl_4]^-$, $[Au^I Br_2]^-$, $[Au^{III} Br_4]^-$, $[Au^I I_2]^-$, $[Au^{III} I_4]^-$, $[Au^I(SCN)_2]^-$, $[Au^{III}(SCN)_4]^-$, and $[Au^I(NH_3)_2]^-$.

* * * * *